United States Patent
Dong

(10) Patent No.: US 9,919,878 B2
(45) Date of Patent: Mar. 20, 2018

(54) SYSTEM FOR LOADING AND UNLOADING CASSETTE AND METHOD FOR LOADING AND UNLOADING CASSETTE

(71) Applicants: BOE Technology Group Co., Ltd., Beijing (CN); Hefei Xinsheng Optoelectronics Technology Co., Ltd., Anhui (CN)

(72) Inventor: Xiang Dong, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 0 days.

(21) Appl. No.: 15/110,412

(22) PCT Filed: Oct. 14, 2015

(86) PCT No.: PCT/CN2015/091936
§ 371 (c)(1),
(2) Date: Jul. 8, 2016

(87) PCT Pub. No.: WO2016/206235
PCT Pub. Date: Dec. 29, 2016

(65) Prior Publication Data
US 2017/0144844 A1    May 25, 2017

(30) Foreign Application Priority Data
Jun. 23, 2015   (CN) .......................... 2015 1 0350810

(51) Int. Cl.
*B65G 47/10*  (2006.01)
*B65G 47/64*  (2006.01)
(Continued)

(52) U.S. Cl.
CPC .......... *B65G 47/643* (2013.01); *B65G 49/06* (2013.01); *H05K 13/0061* (2013.01)

(58) Field of Classification Search
CPC .................................................. B65G 47/643
(Continued)

(56) References Cited

U.S. PATENT DOCUMENTS 4,405,277 A * 9/1983 Burkner ................... B27N 3/22
100/196
4,615,521 A * 10/1986 Mori ..................... B65G 47/643
271/128
(Continued)

FOREIGN PATENT DOCUMENTS

CN       1662874 A     8/2005
CN      200951837 Y    9/2007
(Continued)

OTHER PUBLICATIONS

International Search Report and Written Opinion for International Application No. PCT/CN2015/091936, dated Mar. 21, 2016, 9 pages.

(Continued)

*Primary Examiner* — William R Harp
(74) *Attorney, Agent, or Firm* — Westman, Champlin & Koehler, P.A.

(57) ABSTRACT

The embodiment of the present disclosure relates to a system and a method for loading and unloading a cassette. The system comprises: a lifting device vertically moving between a first height and a second height; a first conveying device in the lifting device to move the cassette horizontally; a second conveying device to move the cassette in horizontally; a third conveying device to move the cassette horizontally, a plurality of first position sensors to detect a position of the lifting device; and a control device to control (Continued)

vertical movements of the lifting device, and adjust further movements of the first conveying device in the lifting device based on an initial stop position of the lifting device such that the first conveying device is aligned with the second conveying device at the first height, or is aligned with the third conveying device at the second height.

20 Claims, 13 Drawing Sheets

(51) Int. Cl.
    *B65G 49/06*     (2006.01)
    *H05K 13/00*     (2006.01)

(58) Field of Classification Search
    USPC .......................................................... 198/435
    See application file for complete search history.

(56) References Cited

U.S. PATENT DOCUMENTS

| | | | | |
|---|---|---|---|---|
| 4,867,299 A * | 9/1989 | Fukuoka | ............... | B65G 47/643 |
| | | | | 198/435 |
| 6,220,420 B1 * | 4/2001 | Jan | ....................... | B65G 47/268 |
| | | | | 198/369.1 |
| 6,394,257 B1 * | 5/2002 | Wheeler | ............... | B65G 47/643 |
| | | | | 198/369.6 |
| 6,976,573 B2 * | 12/2005 | Brixius | .................. | B65G 47/57 |
| | | | | 198/435 |
| 7,699,158 B2 * | 4/2010 | Aust | .................... | B65G 47/643 |
| | | | | 198/369.1 |
| 8,197,172 B2 | 6/2012 | Doherty et al. | | |
| 2016/0163576 A1 | 6/2016 | Nakagawa et al. | | |

FOREIGN PATENT DOCUMENTS

| | | |
|---|---|---|
| CN | 101439804 A | 5/2009 |
| CN | 103569813 A | 2/2014 |
| CN | 103878642 A | 6/2014 |
| CN | 104459425 A | 3/2015 |
| JP | 2008-172089 A | 7/2008 |
| KR | 10-2005-0025941 A | 3/2005 |
| KR | 10-2005-0027976 A | 3/2005 |
| KR | 10-2005-0082550 A | 8/2005 |

OTHER PUBLICATIONS

English translation of Box No. V of the Written Opinion for the International Searching Authority for International Application No. PCT/CN2015/091936, 2 pages.
First Office Action, including Search Report, for Chinese Patent Application No. 201510350810.4, dated Sep. 20, 2016, 25 pages.
Second Office Action for Chinese Patent Application No. 201510350810.4, dated Jan. 22, 2017, 24 pages.
Third Office Action for Chinese Patent Application No. 201510350810.4, dated May 16, 2017, 22 pages.

* cited by examiner

SYSTEM FOR LOADING AND UNLOADING CASSETTE AND METHOD FOR LOADING AND UNLOADING CASSETTE

CROSS-REFERENCE TO RELATED APPLICATION

This application is a Section 371 National Stage Application of International Application No. PCT/CN2015/091936, filed on Oct. 14, 2015, which claims priority to Chinese Patent Application No. 201510350810.4 filed on Jun. 23, 2015, incorporated herein by reference in their entirety.

BACKGROUND OF THE INVENTION

Field of the Invention

The present disclosure relates to a system for loading and unloading a cassette and a method for loading and unloading the cassette, more particularly, relates to a system for loading and unloading a cassette for housing precise components, such as a glass motherboard, a variety of substrates, display screens and the like, and a method for loading and unloading such an cassette.

Description of the Related Art

In the production of a current liquid crystal display (LCD), sheet-shaped precise components, such as a glass motherboard, a variety of substrates, display screens and the like, are generally loaded in a housing case, such as a cassette (CST), so as to convey these precise components among production lines for performing different manufacturing processes in a dust-free condition. In these cases, some production lines may be located in different floors such that these precise components should be conveyed between different floors. Generally, a cross-floor convey is realized by a clean lifter.

In the production of the LCD device, take a conveying operation for the glass motherboards in array substrates plant for instance, due to the limitation of the plant structure and production layout, the cassettes are conveyed up and down between a fourth floor and a second floor by the clean lifter. In the clean lifter, a lift cage is driven by a steel wire rope of a cycle type, such that the lift cage vertically raises and falls, and conveys the cassette between different floors (for example, the fourth floor and the second floor). Since the steel wire rope has the property of elongating due to a longtime service, a long convey distance and an increasing load, it is quite difficult to position the lift cage when it stops. However, in the production of the LCD device, with respect to the conveying of the cassette, there is an extremely high accuracy requirement for the stop position of the lift cage, so as to ensure that the cassette will be smoothly conveyed from the lift cage of the clean lifter to a conveying device outside of the lift cage, or from the conveying device into the lift cage, thereby realizing the smooth load and unload of the cassette and preventing the precise components inside the cassette from colliding with something else and thus being damaged.

SUMMARY OF THE INVENTION

The embodiments of the present disclosure provides a system and a method for loading and unloading a cassette, in which the accurate positioning of a stop position of a lifting device can be realized, such that the cassette will be smoothly loaded and unloaded between a conveying device of a lift cage and the conveying device on a platform.

According to an inventive embodiment of the present disclosure, there is provided a system for loading and unloading a cassette, the system comprising: a lifting device configured to vertically ascend and descend between a first height and a second height; a first conveying device mounted in the lifting device and configured to move the cassette in a horizontal direction; a second conveying device mounted at the first height and configured to move the cassette in a horizontal direction; a third conveying device mounted at the second height and configured to move the cassette in the horizontal direction; a plurality of first position sensors configured to detect a position of the lifting device; and a control device configured to control ascending and descending of the lifting device, and adjust a further rising or falling of the first conveying device in the lifting device based on an initial stop position of the lifting device detected by the first position sensor such that the first conveying device is aligned with the second conveying device at the first height, or is aligned with the third conveying device at the second height.

The system for loading and unloading the cassette according to an embodiment of the present disclosure further comprises an auxiliary lifting device provided in the lifting device and configured to adjust the height of the first conveying device with respect to the lifting device.

In the system for loading and unloading the cassette according to an embodiment of the present disclosure, the auxiliary lifting device comprises: a lifting frame, which is mounted inside the lifting device and on which the first conveying device is mounted; and a first driving motor mounted inside the lifting device and configured to drive the lifting frame to rise or fall.

In the system for loading and unloading the cassette according to an embodiment of the present disclosure, the auxiliary lifting device further comprises a second position sensor configured to detect the height of the first conveying device in the lifting device, and the control device adjusts the height of the lifting frame based on measurements of the first position sensor and the second position sensor.

The system for loading and unloading the cassette according to an embodiment of the present disclosure further comprises two buffer conveying devices mounted between the first conveying device and the second conveying device at the first height and between the first conveying device and the third conveying device at the second height, respectively.

In the system for loading and unloading the cassette according to an embodiment of the present disclosure, each of the first, second and third conveying devices comprises a plurality of rotary drums disposed side by side.

In the system for loading and unloading the cassette according to an embodiment of the present disclosure, each of the rotary drums is coated with monomer casting nylon on its outer surface.

In the system for loading and unloading the cassette according to an embodiment of the present disclosure, each of the first, second and third conveying devices comprises a second driving motor, and a conveyer belt driven by the second driving motor.

The system for loading and unloading the cassette according to an embodiment of the present disclosure further comprises a plurality of third position sensors mounted in the lifting device so as to detect the position of the cassette on the first conveying device.

The system for loading and unloading the cassette according to an embodiment of the present disclosure further comprises a plurality of fourth position sensors mounted in the second conveying device and the third conveying device so as to detect the position of the cassette on the second conveying device or the third conveying device, respectively.

In the system for loading and unloading the cassette according to an embodiment of the present disclosure, each of the third position sensors and the fourth position sensors is a photoelectric sensor, and comprises a light source and a light receiver for receiving a light emitted from the light source, which are provided at two sides of the first conveying device, the second conveying device or the third conveying device in a direction perpendicular to the moving direction of the cassette.

In the system for loading and unloading the cassette according to an embodiment of the present disclosure, the initial stop position of the lifting device is within a predetermined range with respect to the first height or the second height.

According to another inventive embodiment of the present disclosure, there is provided a method for loading and unloading the cassette by using the system for loading and unloading the cassette according to the above embodiment, the method comprising:

step S100: controlling the lifting device to initially stop according to a predetermined first height or second height;

step 200: detecting the initial stop position of the lifting device by the first position sensor; and step 300: adjusting the first conveying device in the lifting device to further ascend and descend based on the initial stop position of the lifting device detected by the first position sensor so as to align the first conveying device with the second conveying device at the first height, or align the first conveying device with the third conveying device at the second height, and unload the cassette on the first conveying device to the second conveying device or the third conveying device, or load the cassette on the second conveying device or the third conveying device to the first conveying device.

In the method for loading and unloading the cassette according to an embodiment of the present disclosure, in a case of loading, in step S100, the lifting device is initially stopped at a position below the first height or the second height; and in a case of unloading, in step S100, the lifting device is initially stopped at a position above the first height or the second height.

In the method for loading and unloading the cassette according to an embodiment of the present disclosure, in the case of loading, the step S300 comprises: moving the cassette to a first position on the second or third conveying device by the second or third conveying device; by means of an auxiliary lifting device provided in the lifting device, driving the first conveying device to rise in the lifting device, such that the first conveying device is aligned with the second conveying device at the first height, or aligned with the third conveying device at the second height; and loading the cassette on the second or third conveying device onto the first conveying device.

In the method for loading and unloading the cassette according to an embodiment of the present disclosure, the step of loading the cassette on the second or third conveying device onto the first conveying device comprises: moving the cassette on the second or third conveying device towards the first conveying device to a second position on the second or third conveying device; further driving the first conveying device to rise in the lifting device to a position above the first or second height by the auxiliary lifting device; completely moving the cassette onto the first conveying device; and driving the lifting device again to arrive a target height.

In the method for loading and unloading the cassette according to an embodiment of the present disclosure, during a process of moving the cassette from the first position to the second position, the height of the first conveying device in the lifting device is adjusted in real time by the auxiliary lifting device, such that the first conveying device keeps in alignment with the second conveying device or the third conveying device.

In the method for loading and unloading the cassette according to an embodiment of the present disclosure, in the case of unloading, step S300 comprises: moving the cassette to a third position on the first conveying device by the first conveying device; by means of an auxiliary lifting device provided in the lifting device, driving the first conveying device to fall in the lifting device, such that the first conveying device is aligned with the second conveying device at the first height, or is aligned with the third conveying device at the second height; and unloading the cassette on the first conveying device onto the second or third conveying device.

In the method for loading and unloading the cassette according to an embodiment of the present disclosure, the step of unloading the cassette on the first conveying device onto the second or third conveying device comprises: moving the cassette on the first conveying device towards the second or third conveying device to a fourth position on the first conveying device; further driving the first conveying device in the lifting device to descend to a position below the first or second height by the auxiliary lifting device; completely moving the cassette onto the second or third conveying device; and driving the lifting device again to arrive a target height.

In the method for loading and unloading the cassette according to an embodiment of the present disclosure, during a process of moving the cassette from the third position to the fourth position, the height of the first conveying device in the lifting device is adjusted in real time by the auxiliary lifting device, such that the first conveying device keeps in alignment with the second conveying device or the third conveying device.

In the method for loading and unloading the cassette according to an embodiment of the present disclosure, a transition of the lifting device from a status of moving at a first constant speed for ascending and descending normally to a status of initial stop, comprises a first decelerating period, a second moving period at a constant speed and a second decelerating period.

In the method for loading and unloading the cassette according to an embodiment of the present disclosure, a transition of the lifting device from a status of moving at a first constant speed for ascending and descending normally to a status of initial stop, comprises a first decelerating period, a moving period at a second constant speed, a second decelerating period, a moving period at a third constant speed and a third decelerating period.

In the system and method for loading and unloading the cassette according to above embodiments of the present disclosure, the control device is used to control the ascending and descending of the lifting device, adjust a further rising or falling of the lifting device based on an initial stop position of the lifting device detected by the first position sensor, such that the first conveying device is aligned with the second conveying device at the first height, or is aligned with the third conveying device at the second height. In this way, the conveying device of the lifting device is accurately aligned with the conveying device on the platform, achieving the smooth loading and unloading of the cassette.

BRIEF DESCRIPTION OF THE DRAWINGS

In order to illustrate the object, technical solution and advantages of the present disclosure more clearly, the embodiments of the present disclosure will be further described in detail hereinafter with reference to the accompanying drawings, in which.

DETAILED DESCRIPTION OF PREFERRED EMBODIMENTS OF THE INVENTION

Figure 1:
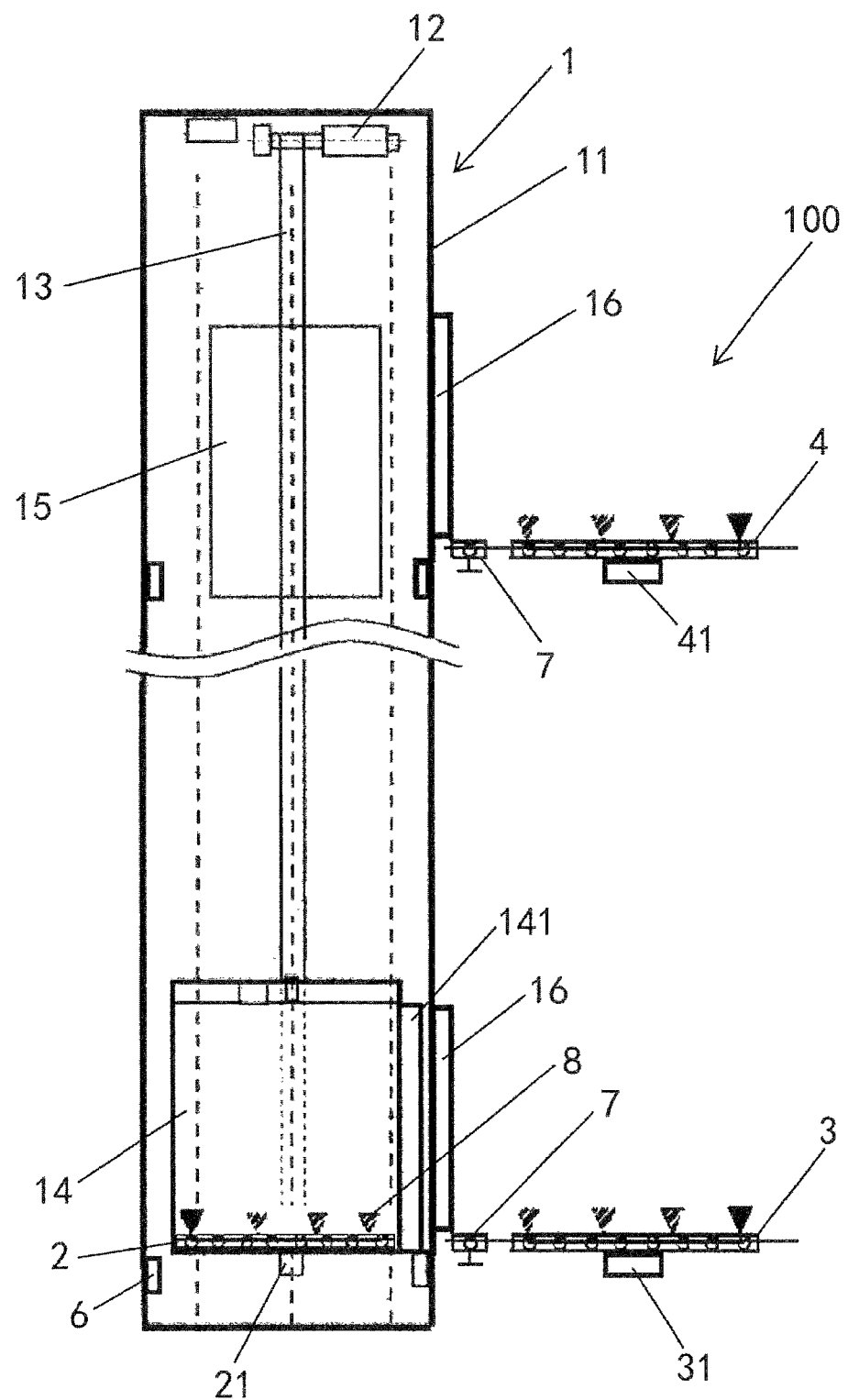
FIG. 1 is a schematic principle view of a system for loading and unloading a cassette according to an exemplary embodiment of the present disclosure.

The technical solution of the present disclosure will be further described in detail with reference to the attached drawings and the embodiments. In the description, same or like reference numerals denote same or like components. The description to the embodiment of the present invention with reference to the attached drawings should not be construed as limitation to the concept of the present disclosure in any way, but only illustration to a general concept of the present disclosure.

According to the general concept of the present disclosure, there is provides a system for loading and unloading a cassette, comprising: a lifting device configured to vertically ascend and descend between a first height and a second height; a first conveying device mounted in the lifting device and configured to move the cassette in a horizontal direction; a second conveying device mounted at the first height and configured to move the cassette in a horizontal direction; a third conveying device mounted at the second height and configured to move the cassette in the horizontal direction; a plurality of first position sensors configured to detect a position of the lifting device; and a control device configured to control ascending and descending of the lifting device, adjust a further rising or falling of the first conveying device in the lifting device based on an initial stop position of the lifting device detected by the first position sensor such that the first conveying device is aligned with the second conveying device at the first height, or is aligned with the third conveying device at the second height.

In the following detailed description, for purposes of easy explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1A:
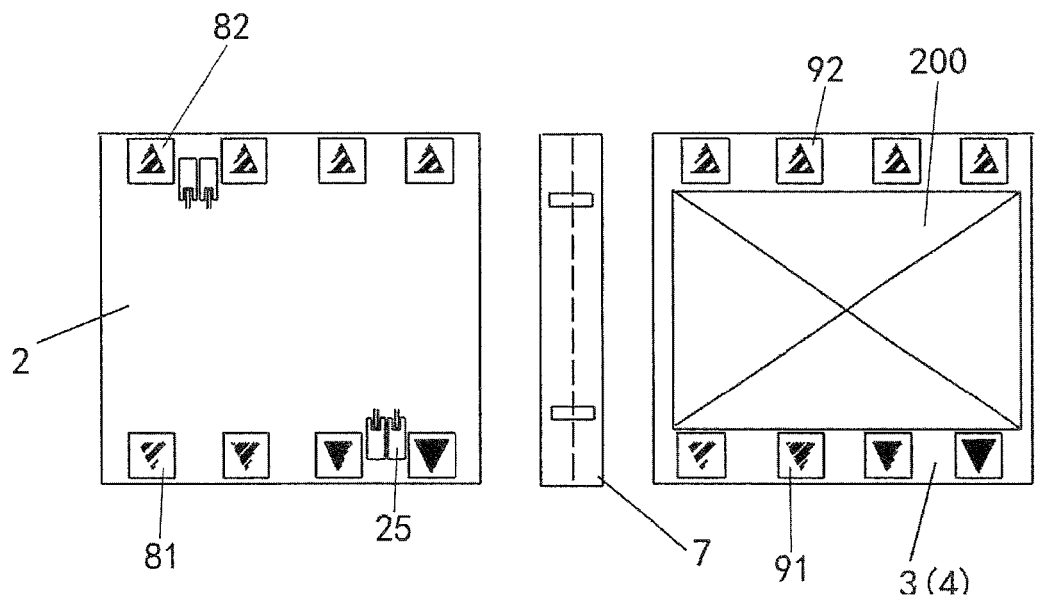
FIG. 1a are top views of a first conveying device and a second or third conveying device in the system for loading and unloading the cassette as shown in FIG. 1.
Figure 2:
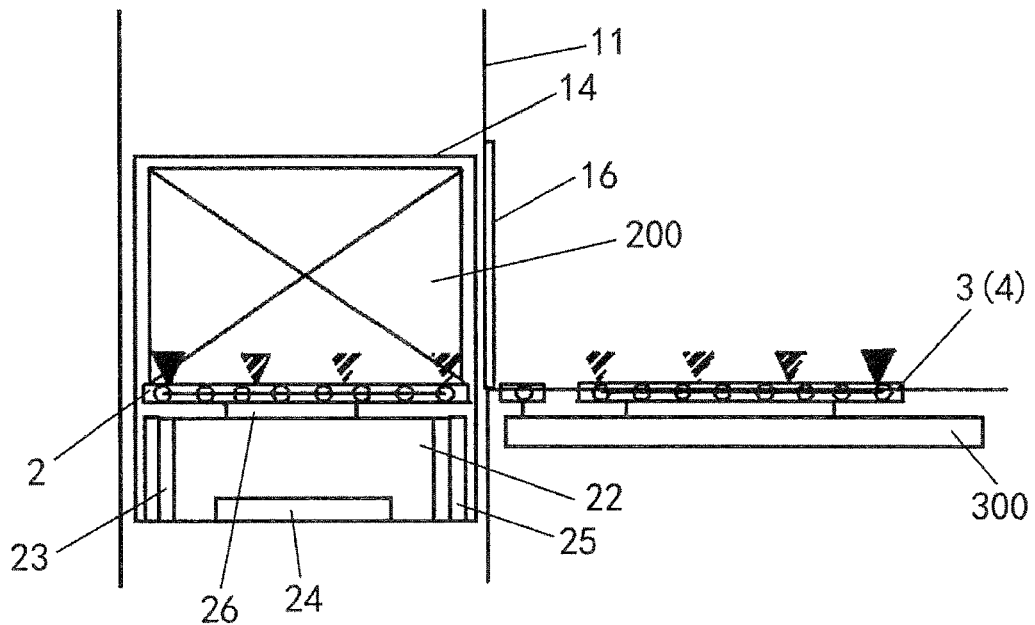
FIG. 2 is schematic principle view when the first conveying device is aligned with the second or third conveying device.
Figure 3:
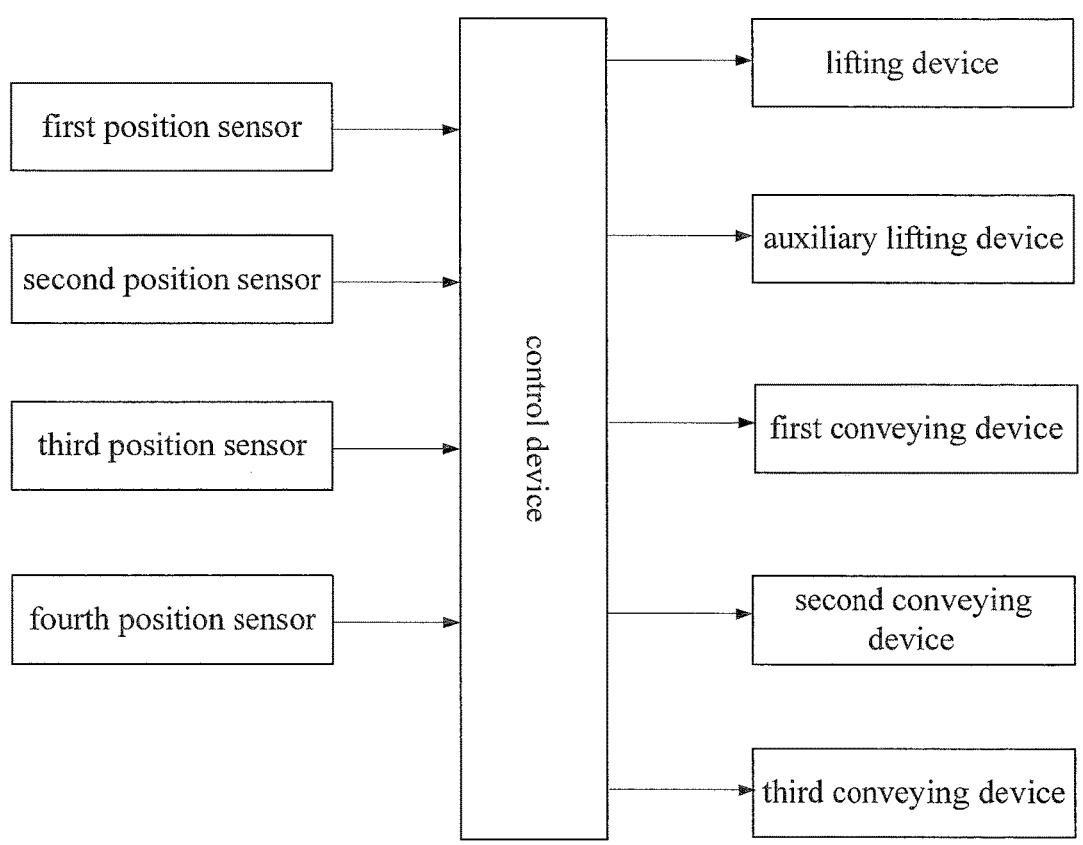
FIG. 3 is control principle block view of the system for loading and unloading the cassette according to an exemplary embodiment of the present disclosure.

FIG. 1 is a schematic principle view of a system for loading and unloading a cassette according to an exemplary embodiment of the present disclosure; FIG. 1a are top views of a first conveying device and a second or third conveying device in the system for loading and unloading the cassette as shown in FIG. 1; FIG. 2 is schematic principle view when the first conveying device is aligned with the second or third conveying device; FIG. 3 is control principle block view of the system for loading and unloading the cassette according to an exemplary embodiment of the present disclosure.

Referring to FIGS. 1 to 3, the embodiment of the present disclosure provides a system 100 for loading and unloading a cassette 200, comprising: a lifting device 1, a first conveying device 2, a second conveying device 3, a third conveying device 4, a plurality of first position sensors 6 and a control device 5. The lifting device 1 is configured to vertically ascend and descend between a first height (for example, a second floor) and a second height (for example, a fourth floor). In an exemplary embodiment, the lifting device 1 is built as an elevator system capable of vertically going up and down in the building, and comprises a motor 12 mounted on a top floor, a wire rope 13 disposed an output shaft of the motor, a lift cage 14 connected to an end of the wire rope 13, a counterweight 15 connected to other end of the wire rope 13, and a hoistway door 16 provided on each floor. The wire rope 13, the lift cage 14 and the counterweight 15 can be mounted in a hoistway 11 passing through all floors, and the lift cage 14 is provided with a cage door 141. The motor 12 can rotate clockwise and counter-clockwise by means of the control of the control device 5, so as to pull the cage lift 14 up and down by the wire rope 13.

The first conveying device 2 is mounted in the lift cage 14 of the lifting device 1, and is configured to move the cassette 200 back and forth in a horizontal direction in the lift cage 14. The second conveying device 3 is mounted at a position at a first height, for example on a platform 300 at the same height as that of the second floor (see FIG. 3). The second conveying device 3 is configured to move the cassette 200 back and forth in a horizontal direction. The third conveying device 4 is mounted at a position at a second height, for example on a platform at the same height as that of the fourth floor. The third conveying device 4 is configured to move the cassette 200 back and forth in a horizontal direction.

A plurality of first position sensors 6 is configured to detect the positions of the lifting device 1. In an embodiment, the first position sensor 6 is a contact sensor, a part of which is provided on the inner wall of the hoistway 11 and other part of which is provided on the lift cage. When the lift cage 14 moves to a height at the level of both sides of each sensor, the part of the position sensor on the inner wall of the hoistway 11 comes into contact with the other part of the position sensor on the lift cage, so as to detect the position of the lift cage in the hoistway. The first position sensor 6 may be also an electromagnetic sensor, or a photoelectric sensor. The control device 5 is configured to control the ascending and descending of the lifting device 1, and adjust a further rising or falling of the first conveying device 2 in the lifting device 1 based on an initial stop position of the lifting device 1 detected by the first position sensor 6 such that the first conveying device 2 is aligned with the second conveying device 3 at the first height, or is aligned with the third conveying device 4 at the second height.

In the system 100 for loading and unloading the cassette according to above embodiment of the present disclosure, the loading and unloading of the cassette 200 are both implemented in a dust-free environment. The control device 5 is configured to control the ascending and descending of the lifting device 1, and adjust a further rising or falling of the first conveying device 2 in the lifting device 1 based on an initial stop position of the lifting device 1 detected by the first position sensor 6, such that the first conveying device 2 is aligned with the second conveying device 3 at the first height, or is aligned with the third conveying device 4 at the second height. Even the steel wire rope has been elongated due to a longtime service, a long convey distance and an increasing load, the first conveying device 2 provided in the lifting device 1 may still be aligned accurately with a conveying device provided on a platform at a respective height so as to achieve the smooth loading or unloading of the cassette 200. In this way, it reduces the possibility of the sheet-shaped precise components in the cassette, such as a glass motherboard, a variety of substrates, display screens and the like, colliding with something else, and prevents these precise components from being broke up or damaged.

Referring to FIG. 2, the system for loading and unloading the cassette according to an exemplary embodiment of the present disclosure further comprises an auxiliary lifting device 22 provided in the lift cage 14 of the lifting device 1 and configured to adjust the height of the first conveying device 2 with respect to the lift cage 14 of the lifting device 1. In this way, the height of the first conveying device 2 in the lift cage 14 may be slightly adjusted by the auxiliary lifting device 22, so as to accurately stop the first conveying device 2 at a required position.

In an embodiment, the auxiliary lifting device 22 comprises a lifting frame 23 and a first driving motor 24 both mounted inside the lift cage 14 of the lifting device 1. The first conveying device 2 is attached on the lifting frame 23 so as to change the height of the first conveying device in the lift cage 14 as the lifting frame 23 rises and falls. The first driving motor 24 is attached within the lift cage 14 of the lifting device and is configured to drive the lifting frame 23 to rise or fall. As an embodiment, the auxiliary lifting device 22 can use a structure of automatic lifting platform. In another embodiment, an output shaft of the first driving motor 24 drives the lifting frame 23 to rise or fall by means of the engagement between a rack and a gear. In a further embodiment, the output shaft of the first driving motor 24 drives the lifting frame 23 to rise or fall by means of a wire rope structure. The lifting frame 23 may also be driven to vertically ascend and descend by means of hydraulic drive. The first conveying device is driven by the first driving motor via the lifting frame, such that the first conveying device rises and falls smoothly and thus the risk of damaging the precise components in the cassette will be reduced.

The auxiliary lifting device 22 further comprises a second position sensor 25 mounted in the lifting device 1 and configured to detect the height of the first conveying device 2 in the lifting device 1, and then the control device 5 adjusts the height of the first conveying device based on the measurements of the first position sensor 6 and the second position sensor 25. In this way, the height of the first conveying device 2 with respect to the second or third conveying device can be accurately determined based on the height of the first conveying device 2 in the lifting device 1 detected by the second position sensor 25 in combination with the height of the lifting device detected by the first position sensor, so as to control the auxiliary lifting device 22 by the control device and thus stop the first conveying device a the required position. In the process of adjusting the auxiliary lifting device, the height of the lift cage of the lifting device is not necessary to be changed, and thus a relatively small drive force is required to drive the auxiliary lifting device to move and achieve the accurate positioning of the first conveying device. The system 100 for loading and unloading the cassette according to an embodiment of the present disclosure further comprises two buffer conveying devices 7, which are mounted between the first conveying device 2 and the second conveying device 3 at the first height and between the first conveying device 2 and the third conveying device 4 at the second height, respectively. The buffer conveying device 7 may be provided to move back and forth under the drive of a motor (not shown), and also be configured to move under the drive of the cassette 200. By providing the buffer conveying devices 7, the smooth conveying of the cassette 200 between the first conveying device 2 and the second conveying device 3 or the third conveying device 4 can be realized.

In an exemplary embodiment, each of the first, second and third conveying devices comprises a driving motor 21, 31 or 41, and a conveyer belt driven by the driving motor. This kind of belt-type conveying may increase the friction between the cassette 200 and the belt and thus achieve the smooth conveying of the cassette 200. In an alternative embodiment, each of the first, second and third conveying devices comprises a plurality of rotary drums disposed side by side, each of which is driven by a motor 26 provided on the lifting frame 23 and rotates in clockwise and anticlockwise directions. This kind of rotary drum-type conveying may increase the support for the cassette. Each of the rotary drums has been coated with monomer casting nylon (called MC nylon for short) on its outer surface so as to prevent the static electricity.

The system 100 for loading and unloading the cassette according to an embodiment of the present disclosure further comprises a plurality of third position sensors 8 mounted in the lift cage of the lifting device 1 so as to detect the position of the cassette 200 on the first conveying device 2. The electric signal regarding the position of the cassette 200 detected by the third position sensors 8 is transmitted to the control device 5 so as to determine a further action of the lifting device, such as a further rising or falling, opening or closing the cage door, such that the cassette 200 in the lift cage 14 will be unloaded to the second conveying device 3 or the third conveying device 4.

The system 100 for loading and unloading the cassette further comprises a plurality of fourth position sensors 9 mounted in the second conveying device 3 and the third conveying device 4 so as to detect the position of the cassette 200 on the second conveying device 3 and the third conveying device 4. The electric signal regarding the position of the cassette 200 on the second conveying device 3 and the third conveying device 4 detected by the fourth position sensors 9 is transmitted to the control device 5 so as to determine a further action of the lifting device, such as opening or closing the cage door, such that the cassette 200 on the second conveying device 3 or the third conveying device 4 will be unloaded into the lift cage 14.

In an exemplary embodiment, each of the third position sensors 8 and the fourth position sensors 9 is a photoelectric sensor, and comprises a light source 81 or 91 and a light receiver 82 or 92 for receiving the light emitted from the light source 81 or 91, which are provided at two sides of the first conveying device 2, the second conveying device 3 or the third conveying device 4 in a direction perpendicular to the moving direction of the cassette 200. The light receiver 82 or 92 converts the received optical signal into an electric signal and then transmits the electric signal to the control device 5. By using the photoelectric sensor, the sensitivity of the position sensors will be improved so as to accurately detect the position of the cassette.

Figure 6:
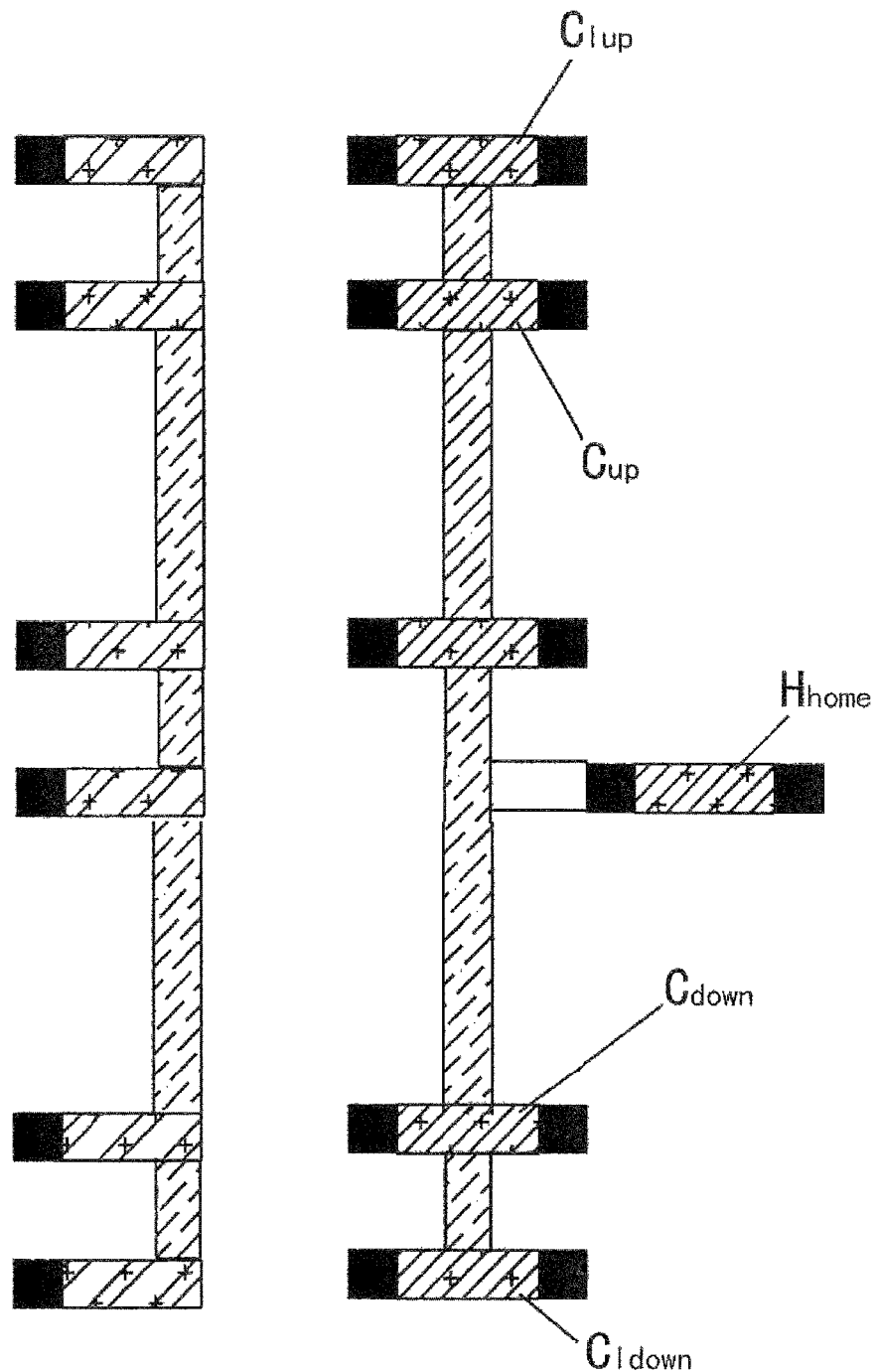
FIG. 6 is schematic principle view of an initial stop position of a lift cage at each floor in the system for loading and unloading the cassette according to the embodiment of the present disclosure.

In an embodiment of the system 100 for loading and unloading the cassette, as illustrated in FIG. 6, the initial stop position of the lift cage 14 of the lifting device 1 is within a predetermined range with respect to the first height or the second height. To be specific, on a certain floor, for example, at the first height $H_{home}$, actually, the initial stop positions $C_{up}$ and $C_{down}$ of the lift cage 14 of the lifting device 1 will not go beyond an upper limit position $Cl_{up}$ and a lower limit position $Cl_{down}$. For example, the upper limit position is above the first height $H_{home}$ by 15 cm, and the lower limit position is below the first height $H_{home}$ by 15 cm. In this way, the initial stop position of the lift cage 14 may be close to the first height $H_{home}$, and a further ascending and descending of the auxiliary lifting device 22 is further controlled conveniently by the control device 5, such that the first conveying device 2 is accurately aligned with the second conveying device 3 or the third conveying device 4.

In a further inventive concept of the present disclosure, there is provided a method for loading and unloading a cassette 200 by using a loading and unloading system 100 according to any embodiment as shown in FIGS. 1 to 3, comprising: step S100: controlling the lifting device 1 to initially stop according to a predetermined first height or second height; step 200: detecting the initial stop position of the lifting device 1 by the first position sensor 6; and step 300: adjusting the first conveying device in the lifting device 1 to further ascend and descend based on the initial stop position of the lifting device 1 detected by the first position sensor 6 so as to align the first conveying device 2 with the second conveying device 3 at the first height, or align the first conveying device 2 with the third conveying device 4 at the second height, and unload the cassette 200 on the first conveying device 2 to the second conveying device 3 or the third conveying device 4, or load the cassette 200 on the second conveying device 3 or the third conveying device 4 to the first conveying device 2.

In the method for loading and unloading the cassette according to above embodiment, the control device 5 is used to control the ascending and descending of the lifting device 1, adjust a further rising or falling of the first conveying device 2 in the lifting device 1 based on the initial stop position of the lifting device 1 detected by the first position sensor 6, such that the first conveying device 2 is aligned with the second conveying device 3 at the first height, or is aligned with the third conveying device 4 at the second height. Even the steel wire rope has been elongated due to a longtime service, a long convey distance and an increasing load, the first conveying device 2 provided in the lifting device 1 may still be aligned accurately with a conveying device provided on a platform at a respective height so as to achieve the smooth loading or unloading of the cassette 200. In this way, it reduces the possibility of the sheet-shaped precise components in the cassette, such as a glass motherboard, a variety of substrates, display screens and the like, colliding with something else, and prevents these precise components from being broke up or damaged.

In an embodiment, in the case of loading, in step S100, the lifting device 1 is initially stopped at a position below the first height or the second height. In this way, during the loading process, before a part of the cassette 200, such as ¼ to ⅓ part thereof, enters the lift cage 14, the cassette 200 will not come in contact with the first conveying device 2 in the lift cage 14, such that the friction and collision to the cassette 200, caused by the first conveying device 2 in the lift cage 14 due to the non-synchronous movement between the first conveying device 2 and the second conveying device 3 or the third conveying device 4, may be reduced.

Further, in the case of unloading, in step S100, the lifting device 1 is initially stopped at a position above the first height or the second height. In this way, during the unloading process, before a part of the cassette 200, such as ¼ to ⅓ part thereof, moves out of the lift cage 14, the cassette 200 will not come in contact with the second conveying device 3 or the third conveying device 4 on the platform, such that the friction and collision to the cassette 200, caused by the second conveying device 3 or the third conveying device 4 due to the non-synchronous movement between the first conveying device 2 and the second conveying device 3 or the third conveying device 4, may be reduced.

FIGS. 4a to 4d are schematic operation flow charts of loading the cassette to the lifting device by using the system for loading and unloading the cassette according to an embodiment of the present disclosure. Referring to FIGS. 4a to 4d, for example, the cassette 200 loaded with precise component therein is required to be conveyed from the fourth floor to the second floor, and the cassette 200 is required to be loaded into the lift cage 14 of the lifting device 1 from the third conveying device 4 on the platform (not shown) located on the fourth floor (i.e. the second height). In this case, in step S100, the lifting device 1 is controlled to stop at an initial loading position below the position of the second height $H_{home2}$, based on the second height predetermined in the control device 5. In step S200, the initial loading position $C_{down}$ of the lifting device 1 is detected by the first position sensor 6, and the height of the first conveying device in the lifting device is detected by the second position sensor 25.

Figure 4A:
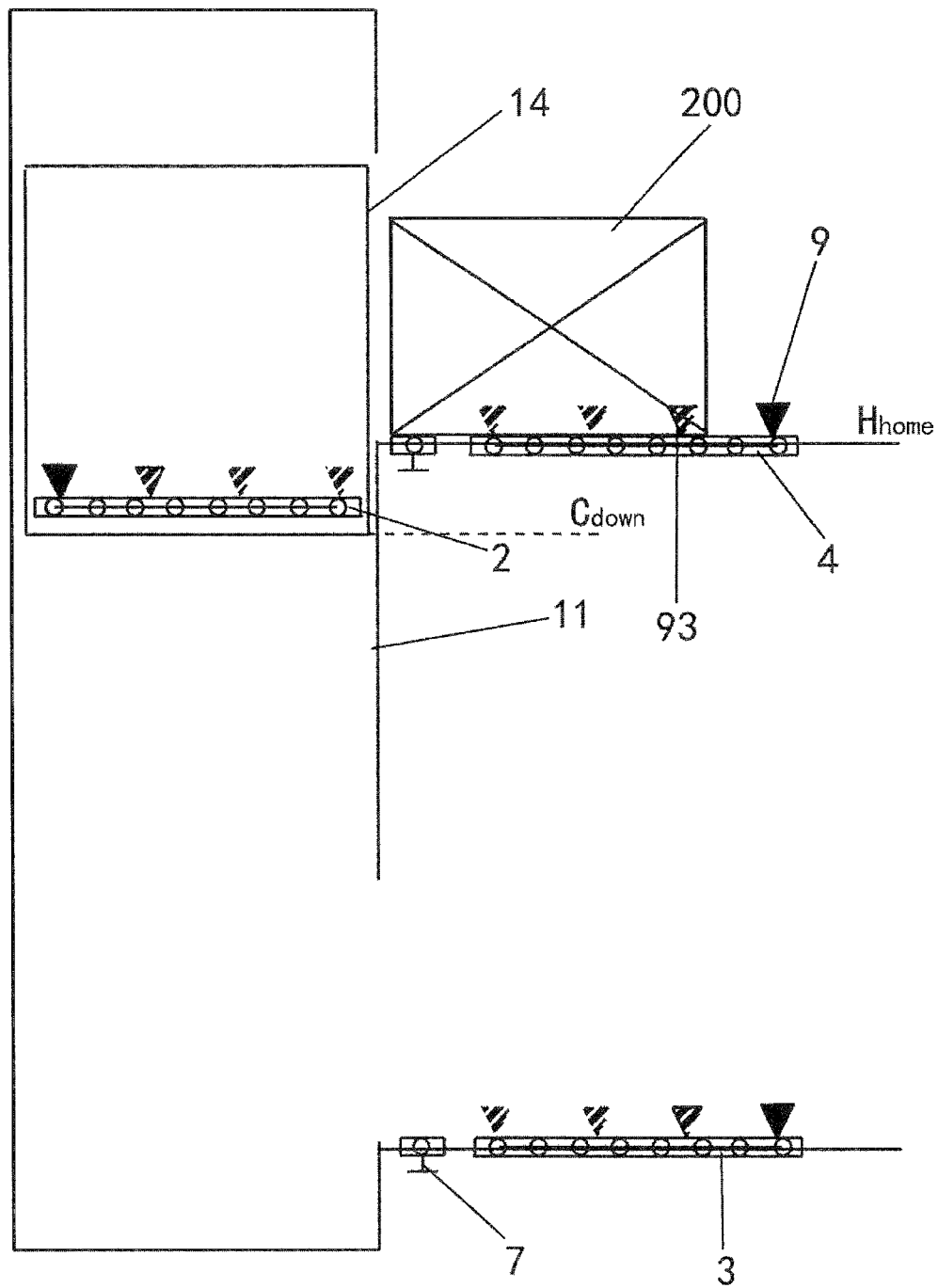
FIGS. 4a to 4d are schematic operation flow charts of loading the cassette to the lifting device by using the system for loading and unloading the cassette according to the embodiment of the present disclosure.
Figure 4B:
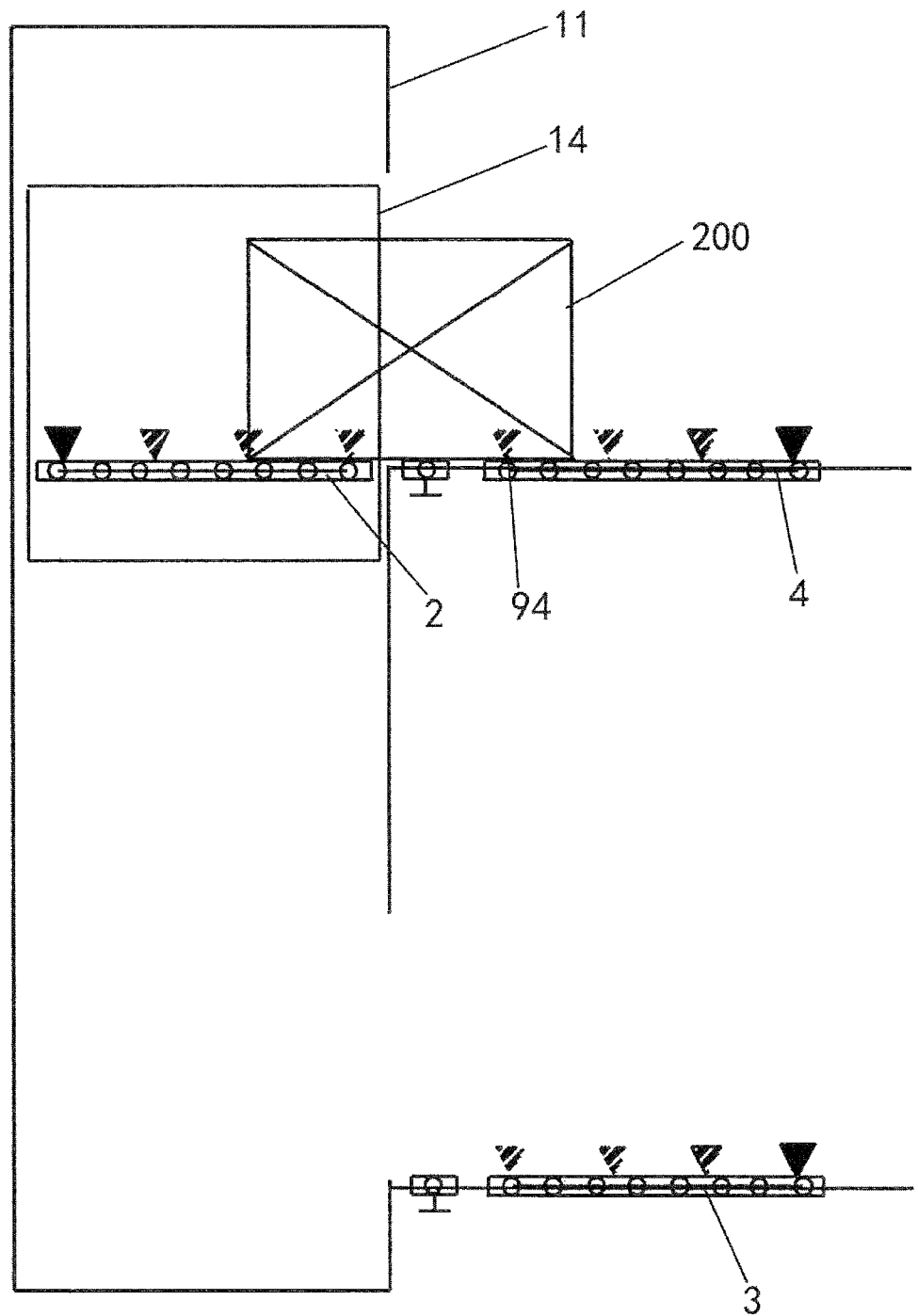

Next, the step S300 is performed. To be specific, as shown in FIG. 4a, the cassette 200 is moved to a first position on the third conveying device 4 by the third conveying device 4, for example, the first position can be determined when the triggering of a second sensor 93 among the fourth position sensors 9 is relieved, and at this time, about ¼ part of the cassette 200 on the left side has been moved out of the third conveying device 4 and moved onto the buffer conveying device 7. Subsequently, based on the initial loading position $C_{down}$ of the lifting device 1 detected by the first position sensor 6 and the height of the first conveying device in the lifting device detected by the second position sensor 25, the control device 5 drive the first conveying device 2 to further rise in the lifting device 1 by means of the auxiliary lifting device 22 provided in the lifting device 1, such that the first conveying device 2 is accurately aligned with the third conveying device 4 at the second height. Subsequently, as shown in FIG. 4b, the hoistway door 16 provided on the hoistway and the cage door 14 are opened, and then the cassette 200 on the third conveying device 4 will be loaded onto the first conveying device 2.

Figure 4C:
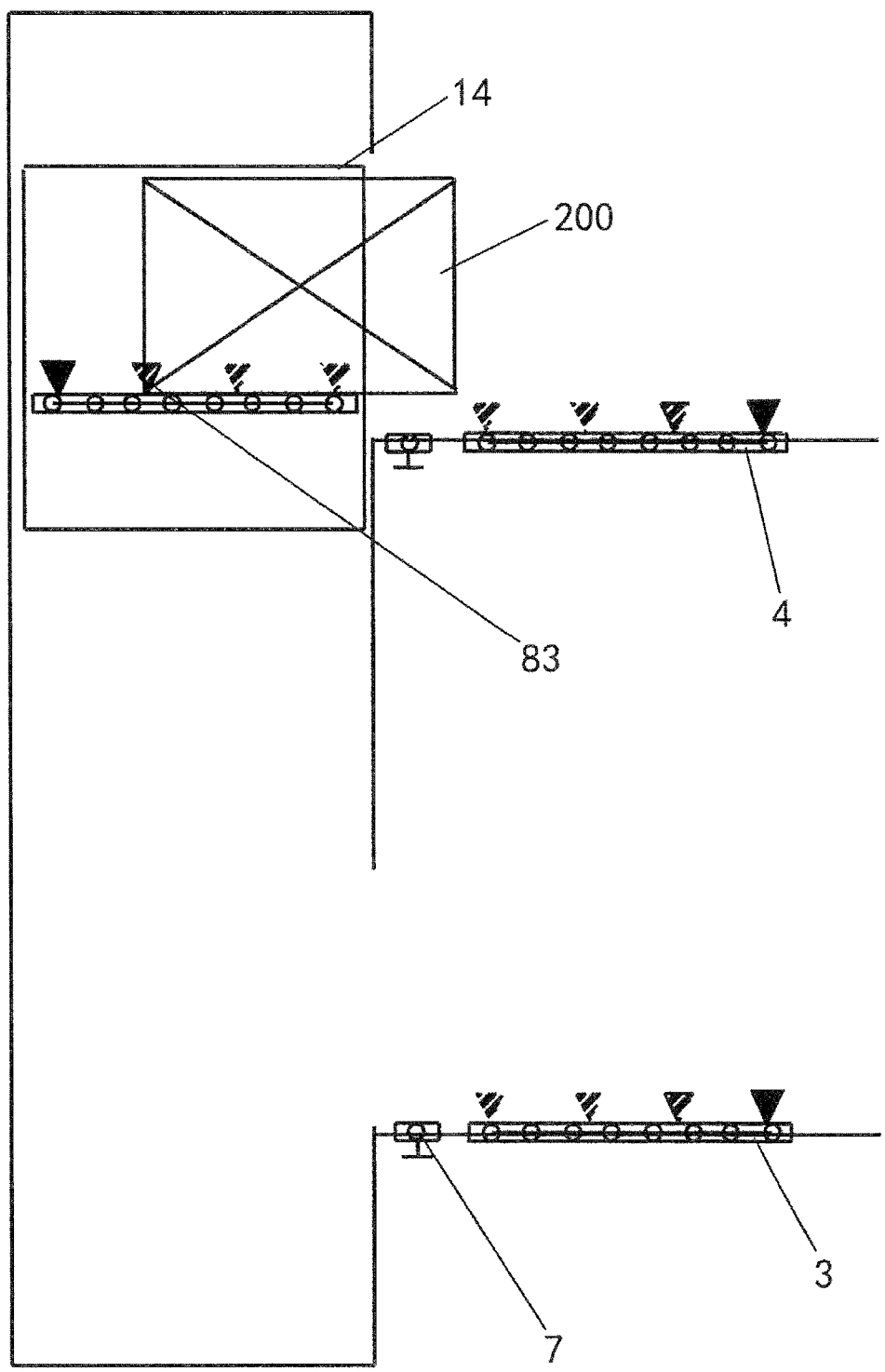
Figure 4D:
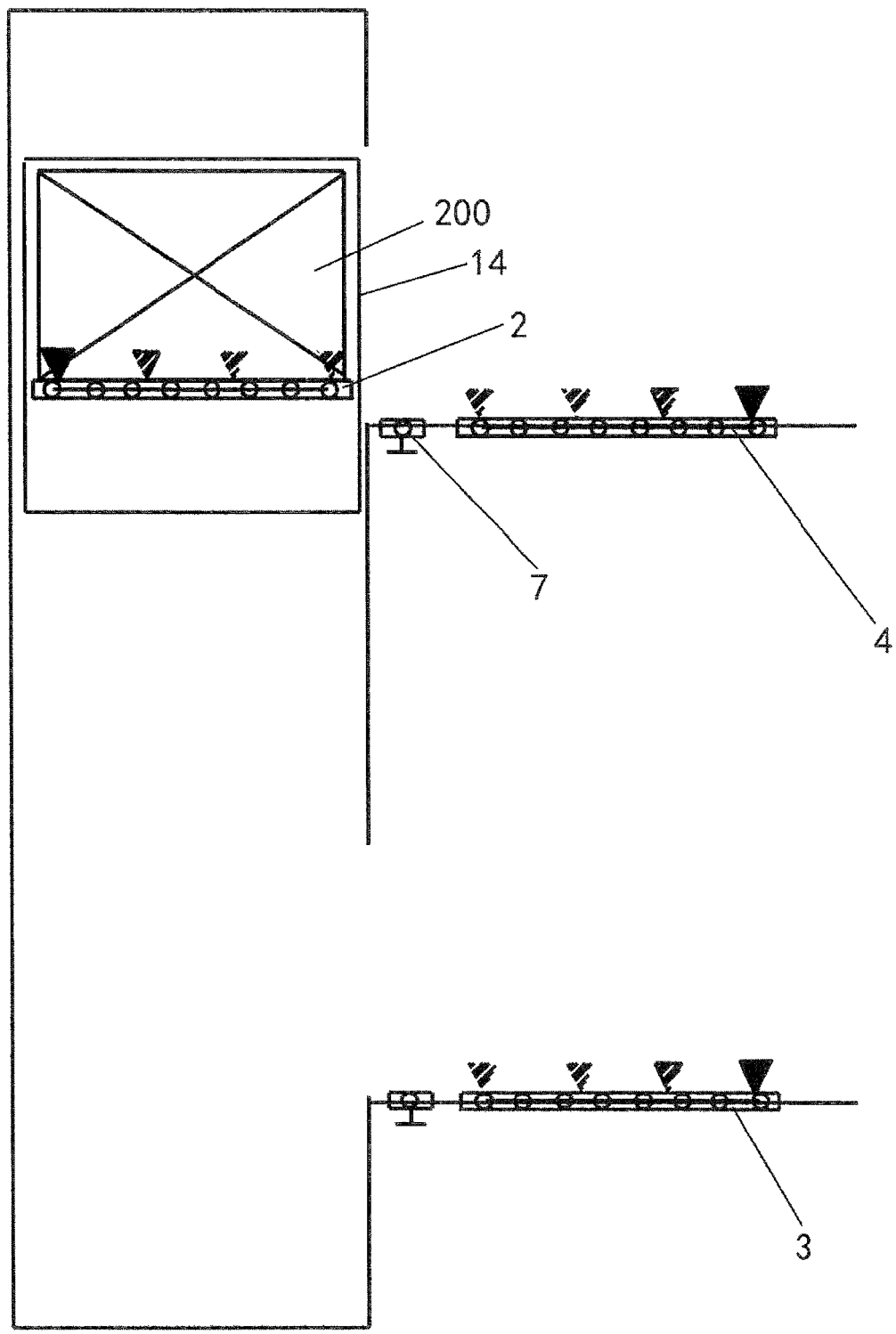

In an embodiment of the method for loading and unloading the cassette, as shown in FIG. 4c, the step of loading the cassette 200 on the third conveying device 4 onto the first conveying device 2 comprises: moving the cassette 200 on the third conveying device 4 towards the first conveying device 2 to a second position on the third conveying device 4, for example, the second position can be determined when the triggering of a second (fourth) sensor 94 among the fourth position sensors 9 is relieved, and at this time, a portion of the cassette 200 except for about ¼ part of the cassette 200 on the right side has been already moved onto the first conveying device 2; driving the first conveying device 2 in the lifting device 1 to rise to a position above the second height by the auxiliary lifting device 22 provided in the lifting device 1; subsequently, completely moving the cassette 200 onto the first conveying device 2, and closing the hoistway door 16 and the cage door 14; and finally driving the lifting device 1 again to a target height, for example the first height at the second floor.

When a portion of the cassette 200 except for about ¼ part of the cassette 200 on the right side has been already moved onto the first conveying device 2, the first conveying device 2 is lifted to the position above the second height. In this way, the cassette 200 will not come into contact with the third conveying device 4 so as to reduce the friction and collision to the cassette 200, caused by the third conveying device 4 due to the non-synchronous movement between the first conveying device 2 and the third conveying device 4.

In the above-described embodiment of the method for loading and unloading the cassette, the cassette 200 is conveyed from the second height located at the fourth floor to the first height located at the second floor, and the cassette 200 is moved from the third conveying device to the first conveying device. It can be understood that, in the same operation way, the cassette 200 is conveyed from the first height located at the second floor to the second height located at the fourth floor, and the cassette 200 is moved from the second conveying device to the first conveying device, and the detailed loading operation thereof will not be described again.

According to an embodiment, in the case of loading operation, as shown in FIG. 4b, during the process of moving the cassette 200 from the first position to the second position, based on the actual height of the first conveying device 2 detected by the first position sensor 6 and the second position sensor 25, the control device 5 adjusts the height of the first conveying device 2 in the lifting device 1 by means of the auxiliary lifting device 22 such that the first conveying device 2 keeps in alignment with the second conveying device 3 or the third conveying device 4. In the case of loading operation, since the cassette 200 moves gradually from the third conveying device 4 to the first conveying device 2, the total weight of the lift cage 14 increases, which may render the height of the lift cage 14 of the lifting device 1 lower than the first (second) height. At this time, the height of the first conveying device 2 is adjusted by the control device 5 in real time, such that the first conveying device 2 keeps in alignment with the third conveying device 4 and the smooth conveying of the cassette 200 from the third conveying device 4 to the first conveying device 2 is remained.

Figure 5A:
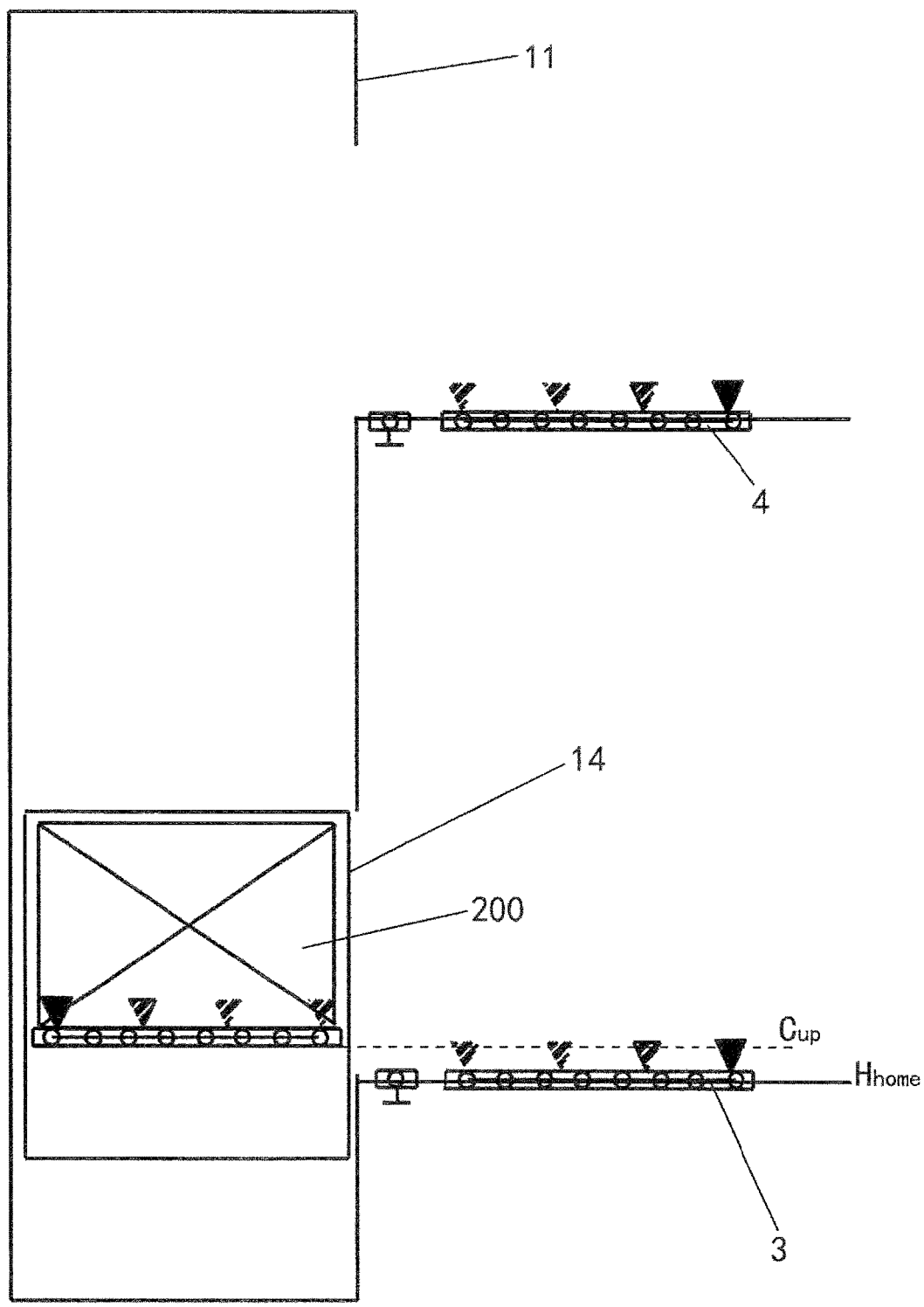
FIGS. 5a to 5d are schematic operation flow charts of unloading the cassette from the lifting device by using the system for loading and unloading the cassette according to the embodiment of the present disclosure.

FIGS. 5a to 5d are schematic operation flow charts of unloading the cassette from the lifting device by using the system for loading and unloading the cassette according to the embodiment of the present disclosure. Referring to FIGS. 5a to 5d, when the lifting device 1 arrives at the second floor, the cassette 200 loaded with precise component therein is required to be unloaded from the lift cage 14 of the lifting device 1 onto the second conveying device 3 on the platform (not shown) at the second floor (i.e. the first height). In this case, as shown in FIG. 5a, in step S100, the lifting device 1 is controlled to stop at an initial unloading position $C_{up}$ above the position of the first height $H_{home1}$, based on the first height predetermined in the control device 5. In step S200, the initial unloading position $C_{up}$ of the lifting device 1 is detected by the first position sensor 6, and the height of the first conveying device in the lifting device is detected by the second position sensor 25.

Figure 5B:
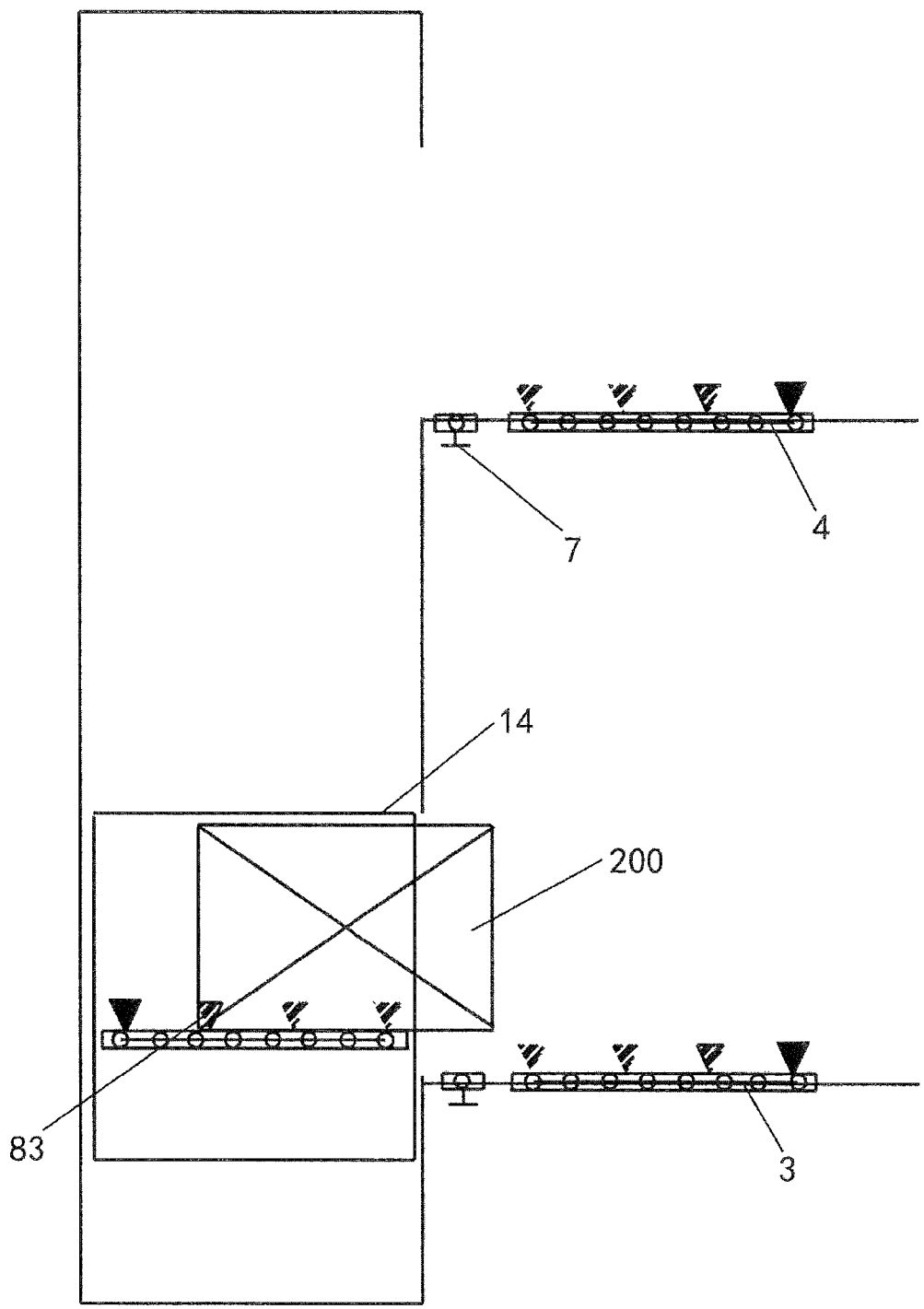
Figure 5C:
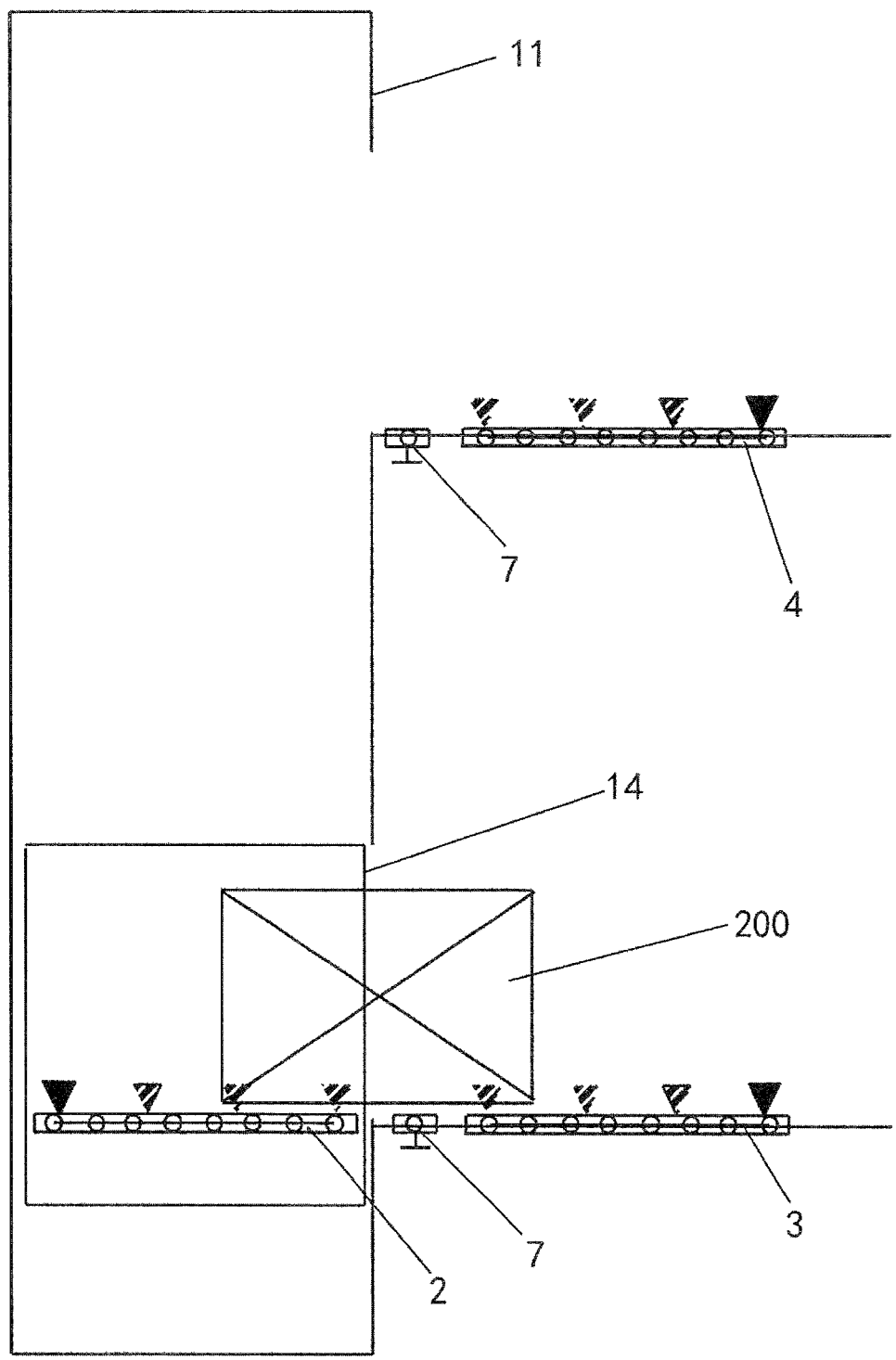

Next, the step S300 is performed. To be specific, as shown in FIG. 5b, when the hoistway door 16 and the cage door 14 are both opened, the cassette 200 is moved to a third position on the first conveying device 2 by the first conveying device 2, for example, the third position can be determined when the triggering of a third sensor 83 among the third position sensors 8 is relieved, and at this time, about ¼ of the cassette 200 on the right side has been moved out of the first conveying device 2. Subsequently, as shown in FIG. 5c, based on the initial unloading position $C_{up}$ of the lifting device 1 detected by the first position sensor 6 and the height of the first conveying device in the lifting device detected by the second position sensor 25, the control device 5 drives the first conveying device 2 to fall in the lifting device 1 by means of the auxiliary lifting device 22 provided in the lifting device 1, such that the first conveying device 2 is accurately aligned with the second conveying device 3 at the first height. Subsequently, the hoistway door 16 provided on the hoistway and the cage door 14 are opened, and then the cassette 200 on the first conveying device 2 will be unloaded onto the second conveying device 3.

Figure 5D:
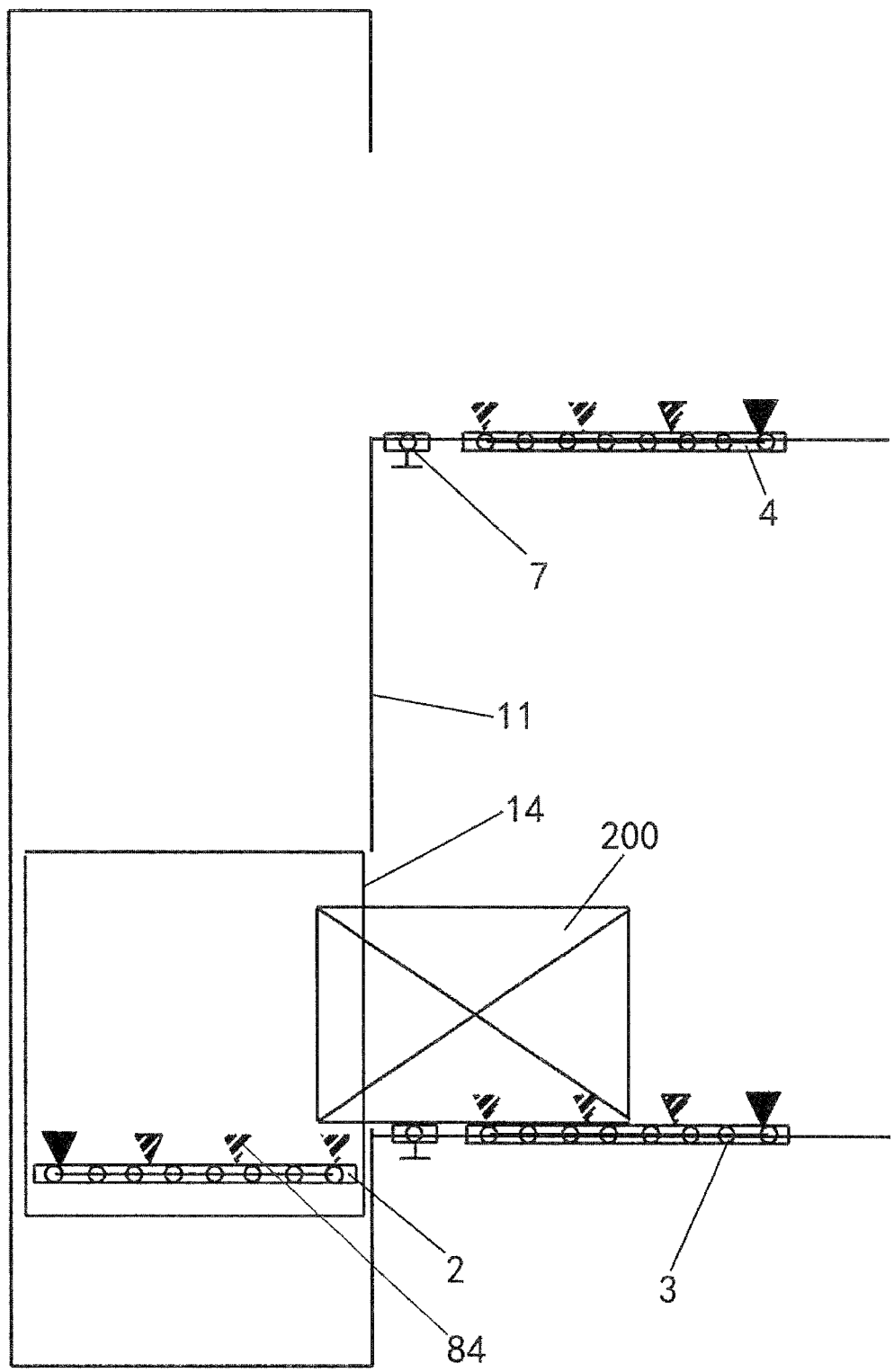

In an embodiment of the method for loading and unloading the cassette, as shown in FIG. 5d, the step of unloading the cassette 200 on the first conveying device 2 onto the second conveying device 3 comprises: moving the cassette 200 on the first conveying device 2 towards the second conveying device 3 to a fourth position on the first conveying device 2, for example, the fourth position can be determined when the triggering of a fourth sensor 84 among the third position sensors 8 is relieved, and at this time, a portion of the cassette 200 except for about ¼ of the cassette 200 on the left side has been already moved onto the second conveying device 3; driving the first conveying device 2 in the lifting device 1 to descend to a position below the first height by the auxiliary lifting device 22 provided in the lifting device 1; subsequently, completely moving the cassette 200 onto the second conveying device 3, and closing the hoistway door 16 and the cage door 14; and finally driving the lifting device 1 again to a target height, for example the second height at the fourth floor.

When a portion of the cassette 200 except for about ¼ of the cassette 200 on the left side has been already moved onto the second conveying device 3, the first conveying device 2 is lowered to the position below the first height. In this way, the cassette 200 will not come into contact with the first conveying device 2 in the lift cage 14 so as to reduce the friction and collision to the cassette 200, caused by the first conveying device 2 due to the non-synchronous movement between the first conveying device 2 and the second conveying device 3.

In the above-described embodiment of the method for loading and unloading the cassette, the cassette 200 is conveyed from the second height located at the fourth floor to the first height located at the second floor, and the cassette 200 is moved from the first conveying device to the second conveying device. It can be understood that, in the same operation way, the cassette 200 is conveyed from the first height located at the second floor to the second height located at the fourth floor, and the cassette 200 is moved from the first conveying device to the third conveying device, and the detailed unloading operation thereof will not be described again.

According to an embodiment, in the case of unloading operation, as shown in FIG. 5c, during the process of moving the cassette 200 from the third position to the fourth position, the height of the first conveying device 2 in the lifting device 1 is adjusted by means of the auxiliary lifting device 22 such that the first conveying device 2 keeps in alignment with the second conveying device 3. In the case of unloading operation, since the cassette 200 moves gradually from the first conveying device 2 to the second conveying device 3, the total weight of the lift cage 14 decreases, which may render the height of the lift cage 14 of the lifting device 1 higher than the second (first) height. At this time, the height of the first conveying device 2 is adjusted by the control device 5 in real time, such that the first conveying device 2 keeps in alignment with the second conveying device 3 and the smooth conveying of the cassette 200 from the first conveying device 2 to the second conveying device 3 is remained.

In the above, it has described the embodiment that the height is adjusted by the auxiliary lifting device so as to accurately align the first conveying device with the second conveying device; however, the present disclosure is not limited thereto. In an alternative embodiment, after the lifting device has initially stop, during the loading or unloading process, based on the detected result of the first position sensor, the lifting device is controlled to further rise or fall directly by the control device, such that the first conveying device further stop at a required position so as to perform the subsequent operation.

In an embodiment of the method for loading and unloading the cassette according to the present disclosure, the process of the lifting device 1 from a status of moving at a first constant speed for ascending and descending normally to a status of initial stop, comprises a first decelerating period, a second moving period at a constant speed and a second decelerating period. In this way, it may stop the lifting device 1 smoothly, reduce the impact on the cassette 200 carried by the lifting device 1 and reduce the possibility of damaging the precise components in the cassette.

Figure 7:
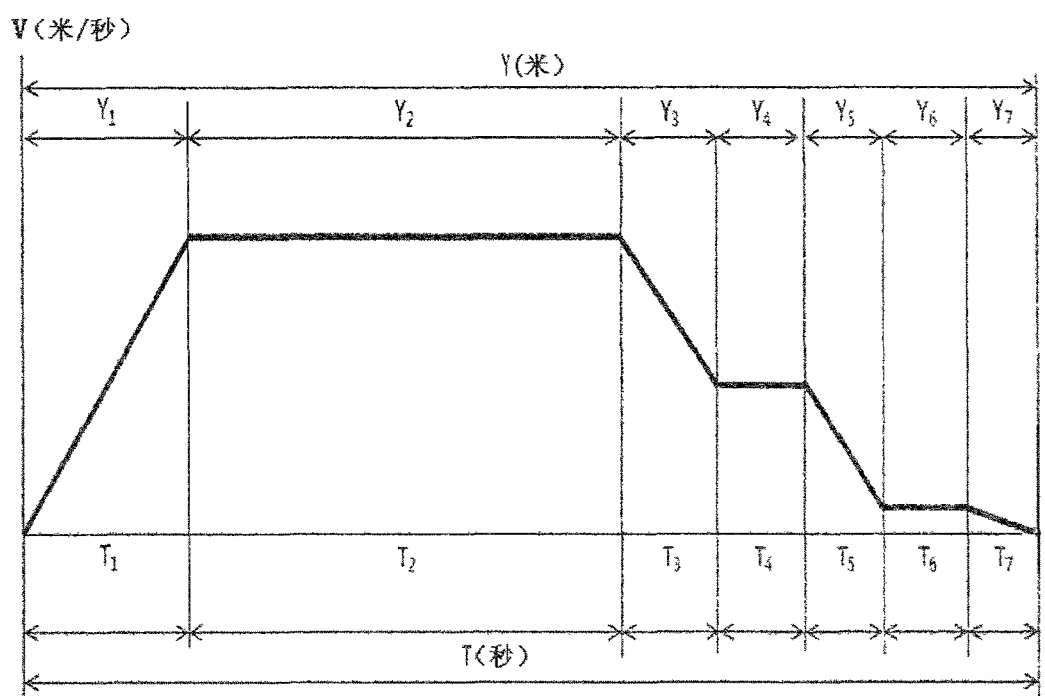
FIG. 7 is a curve chart describing the speed change from start to stop of the lift cage.

FIG. 7 is a curve chart describing the speed change from start to stop of the lift cage. As shown in FIG. 7, the lifting device 1 first accelerates from the stop status, and reaches a predetermined first speed for normal ascending and descending within a time period T1 and moves by a first distance Y1; then, move by a second distance Y2 at the first constant speed within a time period T2. In this case, the process from the status of moving at a first constant speed for normal ascending and descending to the status of arriving the initial stop comprises a first decelerating period, a moving period at a second constant speed, a second decelerating period, a moving period at a third constant speed and a third decelerating period. To be specific, the lifting device 1 at the first constant speed is subject to the first decelerating period within a time period T3 and moves by a third distance Y3; and then the lifting device 1 move by a fourth distance Y4 at the second constant speed within a time period T4; subsequently, the lifting device 1 moving at the second constant speed is subject to the second decelerating period within a time period T5 and moves by a fifth distance Y5; and then the lifting device 1 move by a sixth distance Y6 at the third constant speed within a time period T6; subsequently, the lifting device 1 at the third constant speed is subject to the third decelerating period within a time period T7 and moves by a seventh distance Y7 and arrives the stop status. The resultant number of decelerating periods may be determined based on the total moving distance Y of the lifting device required for completing one time conveying (in the case of FIG. 7, Y=Y1+Y2+Y3+Y4+Y5+Y6+Y7, for example the height from the second floor to the fourth floor), the weight of the cassette and the types of the precise components housed in the cassette, for example, it can set one time, two times or three times of decelerating periods according to the actual situation. In this way, it may stop the lifting device 1 smoothly, reduce the impact on the cassette 200 carried by the lifting device 1 and reduce the possibility of damaging the precise components in the cassette.

Although the embodiments that the lifting device comprises the lift cage and hoistway and other common elevator structures have been described above, the present disclosure is not limited thereto. It should be understood that the lifting device may be a simple elevator structure, for example, the lift cage and the hoistway are both not enclosed, and however, the lift cage comprises a lift platform. The motor for driving the lift cage can be provided on the upper portion of the hoistway or the lower portion of the hoistway.

In the system and method for loading and unloading the cassette according to above embodiments of the present disclosure, the control device is used to control the ascending and descending of the lifting device, adjust a further rising or falling of the lifting device based on an initial stop position of the lifting device detected by the first position sensor, such that the first conveying device is aligned with the second conveying device at the first height, or is aligned with the third conveying device at the second height. In this way, the conveying device of the lifting device is accurately aligned with the conveying device on the platform, so as to achieving the smooth loading and unloading of the cassette. In this way, it reduces the possibility of the sheet-shaped precise components in the cassette, such as a glass motherboard, a variety of substrates, display screens and the like, colliding with something else, and prevents these precise components from being broke up or damaged.

The above detailed embodiments have further described the objects, technical solutions and advantageous effect of the present disclosure in detail. It should be understood that the above embodiments are merely specific embodiments of the present disclosure and are not intended to limit the present disclosure. Any modification, equivalent, improvement and the like within the spirit and principle of the present disclosure should be incorporated in the protection scope of the present disclosure.

As used herein, term "comprising" or "having" should be construed as not excluding other elements or steps, and term "a" or "an" should be construed as not excluding plural of said elements or steps. In addition, any reference numeral in claims should not be construed as the limitation to the scope of the present disclosure.

What is claimed is:

1. A system for loading and unloading a cassette, comprising:
    a lifting device configured to vertically ascend and descend between a first height and a second height;
    a first conveying device mounted in the lifting device and configured to move the cassette in a horizontal direction;
    a second conveying device mounted at the first height and configured to move the cassette in the horizontal direction;
    a third conveying device mounted at the second height and configured to move the cassette in the horizontal direction;
    a plurality of first position sensors configured to detect a position of the lifting device; and
    a control device configured to control ascending and descending of the lifting device, and adjust a further rising or falling of the first conveying device in the lifting device based on an initial stop position of the lifting device detected by the first position sensor such that the first conveying device is aligned with the second conveying device at the first height, or is aligned with the third conveying device at the second height.

2. The system for loading and unloading the cassette according to claim 1, further comprising an auxiliary lifting device provided in the lifting device and configured to adjust the height of the first conveying device with respect to the lifting device.

3. The system for loading and unloading the cassette according to claim 2, wherein, the auxiliary lifting device comprises:
   a lifting frame, which is mounted inside the lifting device and on which the first conveying device is mounted; and
   a first driving motor mounted inside the lifting device and configured to drive the lifting frame to rise or fall.

4. The system for loading and unloading the cassette according to claim 3, wherein, the auxiliary lifting device further comprises a second position sensor configured to detect the height of the first conveying device in the lifting device, and the control device adjusts a height of the lifting frame based on measurements of the first position sensor and the second position sensor.

5. The system for loading and unloading the cassette according to claim 1, wherein, further comprising two buffer conveying devices mounted between the first conveying device and the second conveying device at the first height and between the first conveying device and the third conveying device at the second height, respectively.

6. The system for loading and unloading the cassette according to claim 5, further comprising a plurality of third position sensors mounted in the lifting device so as to detect a position of the cassette on the first conveying device.

7. The system for loading and unloading the cassette according to claim 6, further comprising a plurality of fourth position sensors mounted in the second conveying device and the third conveying device so as to detect a position of the cassette on the second conveying device or the third conveying device, respectively.

8. The system for loading and unloading the cassette according to claim 7, wherein, each of the third position sensors and the fourth position sensors is a photoelectric sensor, and comprises a light source and a light receiver for receiving a light emitted from the light source, which are provided at two sides of the first conveying device, the second conveying device or the third conveying device in a direction perpendicular to the moving direction of the cassette.

9. The system for loading and unloading the cassette according to claim 1, wherein, each of the first, second and third conveying devices comprises a second driving motor, and a conveyer belt driven by the second driving motor.

10. The system for loading and unloading the cassette according to claim 1, wherein, the initial stop position of the lifting device is within a predetermined range with respect to the first height or the second height.

11. A method for loading and unloading the cassette by using the system for loading and unloading the cassette according to claim 1, wherein, the method comprising:
   step S100: controlling the lifting device to initially stop according to a predetermined first height or second height;
   step 200: detecting the initial stop position of the lifting device by the first position sensor; and
   step 300: adjusting the first conveying device in the lifting device to further ascend and descend based on the initial stop position of the lifting device detected by the first position sensor so as to align the first conveying device with the second conveying device at the first height, or align the first conveying device with the third conveying device at the second height, and unload the cassette on the first conveying device to the second conveying device or the third conveying device, or load the cassette on the second conveying device or the third conveying device to the first conveying device.

12. The method for loading and unloading the cassette according to claim 11, wherein,
   in a case of loading, in step S100, the lifting device is initially stopped at a position below the first height or the second height; and
   in a case of unloading, in step S100, the lifting device is initially stopped at a position above the first height or the second height.

13. The method for loading and unloading the cassette according to claim 12, wherein,
   in the case of loading, the step S300 comprising:
   moving the cassette to a first position on the second or third conveying device by the second or third conveying device;
   by means of an auxiliary lifting device provided in the lifting device, driving the first conveying device to rise in the lifting device, such that the first conveying device is aligned with the second conveying device at the first height, or aligned with the third conveying device at the second height; and
   loading the cassette on the second or third conveying device onto the first conveying device.

14. The method for loading and unloading the cassette according to claim 13, wherein,
   the step of loading the cassette on the second or third conveying device onto the first conveying device comprises:
   moving the cassette on the second or third conveying device towards the first conveying device to a second position on the second or third conveying device;
   further driving the first conveying device to rise in the lifting device to a position above the first or second height by the auxiliary lifting device;
   completely moving the cassette onto the first conveying device; and
   driving the lifting device again to arrive a target height.

15. The method for loading and unloading the cassette according to claim 14, wherein,
   during a process of moving the cassette from the first position to the second position, the height of the first conveying device in the lifting device is adjusted in real time by the auxiliary lifting device, such that the first conveying device keeps in alignment with the second conveying device or the third conveying device.

16. The method for loading and unloading the cassette according to claim 12, wherein,
   in the case of unloading, step S300 comprising:
   moving the cassette to a third position on the first conveying device by the first conveying device;
   by means of an auxiliary lifting device provided in the lifting device, driving the first conveying device to fall in the lifting device, such that the first conveying device is aligned with the second conveying device at the first height, or is aligned with the third conveying device at the second height; and unloading the cassette on the first conveying device onto the second or third conveying device.

17. The method for loading and unloading the cassette according to claim 16, wherein, the step of unloading the cassette on the first conveying device onto the second or third conveying device comprises:

moving the cassette on the first conveying device towards the second or third conveying device to a fourth position on the first conveying device;

further driving the first conveying device in the lifting device to descend to a position below the first or second height by the auxiliary lifting device;

completely moving the cassette onto the second or third conveying device; and driving the lifting device again to arrive a target height.

18. The method for loading and unloading the cassette according to claim 17, wherein, during a process of moving the cassette from the third position to the fourth position, the height of the first conveying device in the lifting device is adjusted in real time by the auxiliary lifting device, such that the first conveying device keeps in alignment with the second conveying device or the third conveying device.

19. The method for loading and unloading the cassette according to claim 11, wherein, a transition of the lifting device from a status of moving at a first constant speed for ascending and descending normally to a status of initial stop, comprises a first decelerating period, a moving period at a second constant speed and a second decelerating period.

20. The method for loading and unloading the cassette according to claim 11, wherein, a transition of the lifting device from a status of moving at a first constant speed for ascending and descending normally to a status of initial stop, comprises a first decelerating period, a moving period at a second constant speed, a second decelerating period, a moving period at a third constant speed and a third decelerating period.

* * * * *